(12) United States Patent
Torabi et al.

(10) Patent No.: US 11,545,566 B2
(45) Date of Patent: Jan. 3, 2023

(54) GALLIUM NITRIDE HIGH ELECTRON MOBILITY TRANSISTORS (HEMTS) HAVING REDUCED CURRENT COLLAPSE AND POWER ADDED EFFICIENCY ENHANCEMENT

(71) Applicant: Raytheon Company, Waltham, MA (US)

(72) Inventors: Abbas Torabi, North Andover, MA (US); Brian D. Schultz, Lexington, MA (US); John Logan, Lawrence, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 16/727,252

(22) Filed: Dec. 26, 2019

(65) Prior Publication Data

US 2021/0202729 A1    Jul. 1, 2021

(51) Int. Cl.
*H01L 29/66* (2006.01)
*H01L 29/778* (2006.01)
*H01L 29/20* (2006.01)

(52) U.S. Cl.
CPC ...... *H01L 29/7787* (2013.01); *H01L 29/2003* (2013.01); *H01L 29/66431* (2013.01)

(58) Field of Classification Search
CPC ........... H01L 29/2003; H01L 29/66431; H01L 29/7787; H01L 29/207; H01L 29/7786
See application file for complete search history.

(56) References Cited

U.S. PATENT DOCUMENTS

| | | | | |
|---|---|---|---|---|
| 6,534,801 B2* | 3/2003 | Yoshida | .............. | H01L 29/7787 257/190 |
| 6,583,449 B2* | 6/2003 | Northrup | .............. | H01L 29/207 257/101 |
| 7,179,329 B2* | 2/2007 | Boone | .................... | C30B 23/02 117/2 |
| 7,728,356 B2 | 6/2010 | Suh et al. | | |

(Continued)

FOREIGN PATENT DOCUMENTS

| | | |
|---|---|---|
| JP | 2000068498 | 3/2000 |
| JP | 2005235935 | 9/2005 |
| TW | 200845144 A | 11/2008 |

OTHER PUBLICATIONS

Poblenz et al., "Effect of carbon doping on buffer leakage in AlGaN/GaN high electron mobility transistors," Journal of Vacuum Science & Technology B 22 (2004) pp. 1145-1149.*

(Continued)

*Primary Examiner* — Jay C Kim
(74) *Attorney, Agent, or Firm* — Daly, Crowley, Mofford & Durkee, LLP (57) ABSTRACT

A High Electron Mobility Transistor structure having: a GaN buffer layer disposed on the substrate; a doped GaN layer disposed on, and in direct contact with, the buffer layer, such doped GaN layer being doped with more than one different dopants; an unintentionally doped (UID) GaN channel layer on, and in direct contact with, the doped GaN layer, such UID GaN channel layer having a 2DEG channel therein; a barrier layer on, and in direct contact with, the UID GaN channel layer. One of the dopants is beryllium and another one of the dopants is carbon.

10 Claims, 4 Drawing Sheets

(56) References Cited

U.S. PATENT DOCUMENTS

| | | | |
|---|---|---|---|
| 7,795,642 B2 | 9/2010 | Suh et al. | |
| 7,939,391 B2 | 5/2011 | Suh et al. | |
| 7,972,915 B2 | 7/2011 | Chen et al. | |
| 8,044,432 B2 | 10/2011 | Chen et al. | |
| 8,344,420 B1 | 1/2013 | Jimenez | |
| 8,470,652 B1 | 6/2013 | Brown et al. | |
| 8,519,438 B2 | 8/2013 | Mishra et al. | |
| 8,629,479 B2* | 1/2014 | Nakata | H01L 21/0262 257/192 |
| 8,748,244 B1 | 6/2014 | Corrion et al. | |
| 8,841,702 B2 | 9/2014 | Mishra et al. | |
| 8,895,993 B2* | 11/2014 | Kalnitsky | H01L 29/2003 257/77 |
| 8,933,489 B2 | 1/2015 | Kikkawa | |
| 9,059,266 B2* | 6/2015 | Mitsunaga | H01L 29/778 |
| 9,196,716 B2 | 11/2015 | Mishra et al. | |
| 9,263,439 B2 | 2/2016 | Zhang | |
| 9,269,790 B2* | 2/2016 | Lee | H01L 29/7787 |
| 9,306,009 B2* | 4/2016 | Hallin | H01L 29/2003 |
| 9,419,125 B1 | 8/2016 | Schultz et al. | |
| 9,437,708 B2 | 9/2016 | Mishra et al. | |
| 9,525,413 B2 | 12/2016 | Roberts et al. | |
| 9,620,598 B2* | 4/2017 | Liu | H01L 29/2003 |
| 9,685,345 B2 | 6/2017 | Green et al. | |
| 9,911,868 B2* | 3/2018 | Tanaka | H01L 29/861 |
| 9,941,384 B2* | 4/2018 | You | H01L 29/7786 |
| 9,960,262 B2 | 5/2018 | Schultz et al. | |
| 10,038,070 B2* | 7/2018 | Tanaka | H01L 29/7783 |
| 10,256,332 B1* | 4/2019 | Chen | H01L 29/7783 |
| 10,276,705 B2* | 4/2019 | Schultz | H01L 29/7783 |
| 10,304,375 B2 | 5/2019 | Chen et al. | |
| 10,644,127 B2* | 5/2020 | Moens | H01L 29/66462 |
| 10,833,184 B2* | 11/2020 | Sato | H01L 29/812 |
| 10,903,333 B2 | 1/2021 | Cao et al. | |
| 11,101,378 B2* | 8/2021 | Hwang | H01L 29/7786 |
| 2002/0096692 A1* | 7/2002 | Nakamura | H01L 29/207 257/194 |
| 2006/0108606 A1 | 5/2006 | Saxler et al. | |
| 2010/0258842 A1 | 10/2010 | Lidow et al. | |
| 2010/0258848 A1 | 10/2010 | Lidow et al. | |
| 2012/0193637 A1 | 8/2012 | Kalnitsky et al. | |
| 2013/0009165 A1 | 1/2013 | Park et al. | |
| 2013/0240949 A1 | 9/2013 | Yamada | |
| 2013/0242618 A1 | 9/2013 | Yamada | |
| 2014/0042452 A1 | 2/2014 | Pendharkar et al. | |
| 2014/0252368 A1 | 9/2014 | Lee et al. | |
| 2015/0021616 A1* | 1/2015 | Lee | H01L 29/045 257/76 |
| 2017/0133217 A1* | 5/2017 | Sato | H01L 21/0251 |
| 2017/0170283 A1* | 6/2017 | Laboutin | H01L 21/02381 |
| 2017/0256407 A1* | 9/2017 | Tajiri | C23C 16/303 |
| 2018/0308966 A1* | 10/2018 | Jacquet | H01L 29/205 |
| 2019/0198654 A1 | 6/2019 | Lin et al. | |
| 2019/0371930 A1* | 12/2019 | Shrivastava | H01L 29/7787 |
| 2021/0050216 A1* | 2/2021 | Hwang | H01L 21/02381 |
| 2021/0351288 A1 | 11/2021 | Hwang et al. | |
| 2021/0367055 A1 | 11/2021 | Hwang et al. | |

OTHER PUBLICATIONS

Willoughby et al., "Photo-EPR study of compensated defects in Be-doped GaN substrates," Journal of Applied Physics 125 (2019) 075701.*

Katzner et al., "Molecular Beam Epitaxy of Beryllium-doped GaN Buffer Layers for AlGaN/GaN HEMTs," IEEE (2003) pp. 233-234.*

Birkle et al., Studies on Carbon as Alternative P-Type Dopant for Gallium Nitride, MRS Internet Journal of Nitride Semiconductor Research 4S1 (1999) G5.6.*

Storm et al., "Proximity effects of beryllium-doped GaN buffer layers on the electronic properties of epitaxial AlGaN/GaN heterostructures," Solid-State Electronics (2010).*

Willoughby et al., "A compensating point defect in carbondoped GaN substrates studied with electron paramagnetic resonance spectroscopy," Journal of Applied Physics 123 (2018) 161547.*

Storm et al., "Proximity effects of beryllium-doped GaN buffer layers on the electronic properties of epitaxial AlGaN/GaN heterostructures," Solid-State Electronics 54 (2010) pp. 1470-1473.*

Meyer et al., "High Electron Velocity Submicrometer AlN/GaN MOS-HEMTs on Freestanding GaN Substrates," IEEE Electron Device Letters 34 (2013) pp. 199-201.*

Gamarra et al., "Optimisation of a carbon doped buffer layer for AlGaN/GaN HEMT devices," Journal of Crystal Growth 414 (2015) pp. 232-236.*

Joshi et al., "Part II: Proposals to Independently Engineer Donor and Acceptor Trap Concentrations in GaN Buffer for Ultrahigh Breakdown AlGaN/GaN HEMTs," IEEE Transactions on Electron Devices 66 (2019) pp. 570-577.*

Moustakas et al., "Experimental Evidence that the Plasma-assisted MBE Growth of Nitride Alloys is a Liquid Phase Epitaxy Process," ECS Transactions, 35 (2011) pp. 63-71.*

Notification of Transmittal of the International Search Report and the Written Opinion of the International Searching Authority, or the Declaration, PCT/US2020/022228, dated Jun. 29, 2020, 1 page.

International Search Report, PCT/US2020/022228, dated Jun. 29, 2020, 5 pages.

Written Opinion of the International Searching Authority, PCT/US2020/022228, dated Jun. 29, 2020, 10 pages.

Amano, et al.; "P-Type Conduction in Mg-Doped GaN Treated with Low-Energy Electron Beam Irradiation (LEEBI)"; Japanese Journal of Applied Physics; vol. 28; No. 12; pp. L 2112-L 2114; Dec. 1989; 4 pages.

Bernardini, et al.; "Theoretical evidence for efficient p-type doping of GaN using beryllium"; Applied Physics Letters; vol. 70; Issue 22; Oct. 1996; 3 pages.

Fujieda, et al; Growth Characterization of Low-Temperature MOCVD GaN_Comparison between $N_2H_4$ and $NH_3$; Japanese Journal of Applied Physics; vol. 26; No. 12; pp. 2067-2071; Dec. 1987; 5 pages.

Greco, et al.; "Review of technology for normally-off HEMTs with p-GaN gate"; Materials Science in Semiconductor Processing 78; pp. 96-106; 2018; 11 pages.

Green; "Polarity control during molecular beam epitaxy growth of Mg-doped GaN"; American Vacuum Society; J. Vac. Sci. Technol. B; vol. 21; No. 4; JVST B—Microelectronics and Nanometer Structures; pp. 1804-1811; Jul./Aug. 2003; 8 pages.

Hasegawa, et al.; "Current Transport, Fermi Level Pinning, and Transient Behavior of Group-III Nitride Schottky Barriers"; Journal of the Korean Physical Society; vol. 55; No. 3; pp. 1167-1179; Sep. 2009; 13 pages.

Heikman, et al.; "Non-planar Selective Area Growth and Characterization of GaN and AlGaN"; Jpn. J. Appl. Phys.; vol. 42; Part 1; No. 10; pp. 6276-6283; Oct. 2003; 8 pages.

Katzer, et al.; "Molecular beam epitaxy of beryllium-doped GaN buffer layers for AlGan/GaN HEMTs"; Journal of Crystal Growth 251; pp. 481-486; 2003; 6 pages.

Latham, et al.; "Calculated properties of point defects in Be-doped GaN"; The American Physical Society; Physical Review B 67, 205206; 2003; 8 pages.

Lee, et al; "Compensation in Be-doped Gallium Nitride Grown Using Molecular Beam Epitaxy"; Material Research Society; vol. 892; pp. 729-733; 2006; 5 pages.

Lyons, et al.; "First-principles theory of acceptors in nitride semiconductors"; Wiley Online Library; Phys. Status Solidi B 252; No. 5; pp. 900-908; Apr. 6, 2015; 9 pages.

Lyons, et al.; Impact of Group-II Acceptors on the Electrical and Optical Properties of GaN; Japanese Journal of Applied Physics 52; 2013; 5 pages.

Lyons, et al.; "Shedding light on doping of gallium nitride"; SPIE Newsroom; Jul. 19, 2012; 3 pages.

Meneghini, et al.; Technology and Reliability of Normally-Off GaN HEMTs with p-Type Gate; MDPI; Energies 2017; vol. 10; Issue 153; Jan. 25, 2017; 15 pages.

(56) References Cited

OTHER PUBLICATIONS

Roberts, et al.; Control of threshold voltage in E-mode and D-mode GaN-on-Si metal-insulator-semiconductor heterostructure field effect transistors by in-situ fluorine doping of atomic layer deposition Al2O3 gate dielectrics; Applied Physics Letters 108, 072901; 2016; 6 pages.
Sokolich; "What is Fermi-level pinning, and how could it affect the behavior of the semiconductor?"; Oct. 3, 2018; 6 pages.
Storm, et al.; "Reduction of buffer layer conduction near plasma-assisted molecular-beam epitaxy grown GaN/AlN interfaces by beryllium doping"; Applied Physics Letters; vol. 81; No. 20; Nov. 11, 2002; 3 pages.
Van de Walle, et al.; "First-principles studies of beryllium doping of GaN"; The American Physical Society; Physical Review B; vol. 63, 245205; Jun. 8, 2001; 17 pages.
Yang, et al.; "Mg incorporation in GaN grown by plasma-assisted molecular beam epitaxy at high temperatures"; Journal of Crystal Growth 439; pp. 87-92; 2016; 11 pages.
Yuliang, et al.; "AlGaN/GaN high electron mobility transistors with selective area grown p-GaN gates"; Journal of Semiconductors; vol. 37; No. 11; May 6, 2016; 3 pages.
Chih-Hao Li, Yan-Cheng Jiang, Hsin-Chang Tsai, Yi-Nan Zhong, Yue-ming Hsin$^z$, Device Characteristics of AlGaN/GaN HEMTs with [-GaN Cap Layer, ECS Journal of Solid State Science and Technology, Jul. 30, 2019, JSS Focus Issue On GaN-Based Electronics for Power, RF, and Rad-Hard Applications, pp. S3125-S3128, 4 pages.
Subramaniam Arulkumran, Takashi Egawa, Hiroyasu Ishikawa, Studies on the Influences of i-GaN, n-DaN, p-GaN and InGaN Cap Layers in AlGaN/GaN High-Electron-Mobility Transistors, Japanese Journal of Applied Physics, vol. 44, No. 5A. 2005, published May 10, 2005, pp. 2953-2960, 8 pages.
Storm, et al.; "Proximity effects of beryllium-doped GaN buffer layers on the electronic properties of epitaxial AlGaN/GaN heterostructures"; Solid State Electronics 54; pp. 1470-1473; Jun. 26, 2010; 4 pages.
Notification of Transmittal of the International Search Report and the Written Opinion of the ISA, or the Declaration, dated Feb. 17, 2021 for International Application No. PCT/US2020/058656; 1 Page.
International Search Report dated Feb. 17, 2021 for International Application No. PCT/US2020/058656; 5 Pages.
Written Opinion of the ISA dated Feb. 17, 2021 for International Application No. PCT/US2020/058656; 10 Pages.
D.F. Storm, et al., Proximity effects of beryllium-doped GaN buffer layers on the electronic properties of epitaxial AlGaN heterostructures, Solid State Electronics 54, 2010, pp. 1470-1473, 4 pages.
Non Final Office Action dated Oct. 13, 2020, U.S. Appl. No. 16/379,077, 22 pages.
D.F. Storm, D.S. Katzer, D.A. Deen, R. Bass, D.J. Meyer, J.A. Roussos, S.C. Binari, T. Paskova, E.A. Preble, K.R. Evans, Proximity effects of beryllium-doped GaN buffer layers on the electronic properties of epitaxial AlGaN/GaN heterostructures, Solid-State Electronics, 2010, 4 pages, pp. 1470-1473.
John J. Lyons, Anderson Janotti, Chris G. Van De Walle, Impact of Group-II Acceptors on the Electrical and Optical Properties of GaN, Japanese Journal of Applied Physics 52, 2013, 5 pages, pp. 08JJ04-1-08JJ04-5.
Fabio Bernardini, Vincenzo Fiorentini, Andrea Bosin, Theoretical evidence for efficient 92 -type doping of GaN using beryllium, INFM-Dipartimento di Scienze Fisiche, Universitá di Cagliari, via Ospedale 72, I-09124 Cagliari, Italy, TECHSO, S.p.A, Elmas (CA) Italy, Sep. 3, 2018, 3 pages, pp. 1-3.
K. Lee, B. Vanmil, M. Luo, T.H. Myers, A. Armstrong, S.A. Ringel, M. Rummukainen, K. Saarinen, Compensation in Be-doped Gallium Nitride Grown Using Molecular Beam Epitaxy, Mater, Res. Soc. Symp. Proc. vol. 892 © 2006 Materials Research Society, 5 pages, pp. 729-733.

Robert P. Vaudo, Xueping Xu, Allan Salant, Joseph Malcarne, George R. Brandes, Characteristics of semi-insulating, Fe-doped GaN substrates, physica status solidi (a)/vol. 200, issue 1, Oct. 9, 2003, 11 pages.
D.F. Storm, D.S. Katzer, D.A. Deen, R. Bass, D.J. Meyer, J.A. Roussos, Reduction of buffer layer condition near plasma-assisted molecular-beam, epitaxy grown GaN/AlN interfaces by beryllium doping, Applied Physics Letters, vol. 81, No. 20, Nov. 11, 2002,, 3 pages, pp. 3819.
Chris G. Van De Walle, Sukit Limpijumnong, Jörg Neugebauer, First-Principles studies of beryllium doping of GaN, Physical Review B, vol. 63, 24505, 2001, 17 pages, pp. 245205-1-245205-17.
Response to U.S. Non-Final Office Action dated Oct. 13, 2020 for U.S. Appl. No. 16/379,077; Response Filed Apr. 13, 2021; 11 Pages.
U.S. Notice of Allowance dated May 11, 2021 for U.S. Appl. No. 16/379,077; 11 Pages.
PCT International Preliminary Report on Patentability dated Oct. 21, 2021 for International Application No. PCT/US2020/022228; 10 Pages.
Taiwan Office Action (with Machine English Translation) dated Nov. 26, 2020 for Taiwan Application No. 109108964; 16 Pages.
Response (with Machine English Translation) to Taiwan Office Action dated Nov. 26, 2020 for Taiwan Application No. 109108964; Response Filed May 17, 2021; 16 Pages.
Taiwan Allowance Decision (with Machine English Translation) dated Aug. 23, 2021 for Taiwan Application No. 109108964; 4 Pages.
U.S. Non-Final Office Action dated Sep. 17, 2021 for U.S. Appl. No. 16/881,412; 13 Pages.
Response to U.S. Non-Final Office Action dated Sep. 17, 2021 for U.S. Appl. No. 16/881,412; Response filed Dec. 14, 2021; 6 Pages.
PCT International Search Report and Written Opinion dated Jun. 21, 2021 for International Application No. PCT/US2021/020626; 13 Pages.
Claim Amendments filed on Feb. 8, 2022 for Singapore Application No. 11202106757R; 7 Pages.
Response (with English Translation) to Taiwan Office Action dated Sep. 7, 2021 for Taiwan Application No. 109139336; Response filed Mar. 3, 2022; 12 Pages.
Taiwan Office Action with English Translation and IPO Search Report, Application No. 109139336, dated Jul. 26, 2021, 10 pages.
U.S. Notice of Allowance dated Mar. 9, 2022 for U.S. Appl. No. 16/881,412; 7 Pages.
PCT International Preliminary Report on Patentability dated Jul. 7, 2022 for International Application No. PCT/US2020/058656; 9 Pages.
Taiwan Office Action (with English Translation) dated Jul. 6, 2022 for Taiwan Application No. 109139336; 7 Pages.
U.S. Restriction Requirement dated Aug. 11, 2022 for U.S. Appl. No. 17/380,379; 6 Pages.
Response to U.S. Restriction Requirement dated Aug. 11, 2022 for U.S. Appl. No. 17/380,379; Response filed Aug. 17, 2022; 1 Page.
U.S. Non-Final Office Action dated Aug. 31, 2022 for U.S. Appl. No. 17/380,379; 8 Pages.
Taiwan Office Action (with English Translation) dated Aug. 16, 2022 for Taiwan Application No. 110108699; 14 Pages.
Response (with Machine English Translation) to Written Opinion dated Feb. 17, 2021 for Israeli Application No. 293444; Response filed Jun. 3, 2022; 2 Pages.
Response (with English Translation) to Taiwan Office Action dated Aug. 16, 2022 for Taiwan Application No. 110108699; Response filed Oct. 19, 2022; 38 Pages.
Response to U.S. Non-Final Office Action dated Aug. 31, 2022 for U.S. Appl. No. 17/380,379; Response filed Nov. 1, 2022; 8 Pages.
Indian Examination Report (with English Translation) dated Sep. 9, 2022 for Indian Application No. 202247026205; 6 Pages.
Israeli Notice of Allowance (with English Translation) dated Sep. 20, 2022 for Israeli Application No. 293444; 4 Pages.

* cited by examiner

GALLIUM NITRIDE HIGH ELECTRON MOBILITY TRANSISTORS (HEMTS) HAVING REDUCED CURRENT COLLAPSE AND POWER ADDED EFFICIENCY ENHANCEMENT

TECHNICAL FIELD

This disclosure relates generally to High Electron Mobility Transistors (HEMTs) and more particularly to Gallium Nitride (GaN) HEMTs having reduced current collapse and power added efficiency enhancement.

BACKGROUND OF THE INVENTION

Figure 1:
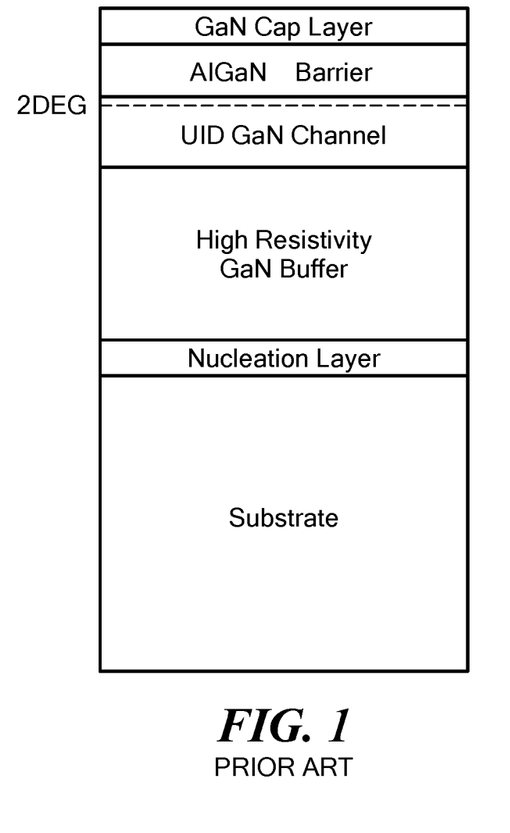
FIG. 1 is a diagrammatical, cross-sectional sketch of a Group III-Nitride HEMT structure according to the PRIOR ART.

As is known in the art, current collapse (or dispersion) in pulsed IV measurement is a leading indicator of RF performance and power added efficiency (PAE) of a high frequency HEMT transistor. Gallium nitride (GaN) based HEMTs are prone to high levels of current collapse (CC). The geometry of the device structure, surface passivation, and the epitaxial structure of HEMTs all contribute to the CC. In terms of the epitaxial structure, the doping schemes used in the GaN buffer layer and/or barrier, the density and location of defects (such as impurity atoms or dislocations), and the quality of layer interfaces have particular impact on the CC. One such HEMT epitaxial structure is shown in FIG. 1. Here the structure includes:

A Substrate, such as Si, $Al_2O_3$, or SiC;

A Nucleation layer, such as AlN or Graphene, may not be present;

A High-Resistivity (typically greater than $1 \times 10^5$ ohm*cm) GaN Buffer, typically doped such as to render GaN insulating (dopants such as carbon, magnesium, iron) with thickness 200 nm to several microns;

An Unintentionally Doped (UID) GaN Channel, no intentional dopants, typical thickness 50-500 nm, 2D electron gas (2DEG) resides near UID GaN Channel to barrier interface;

A Barrier layer, such as AlGaN, InAlN, InAlGaN (traditional III-Nitrides), or ScAlN (rare earth-Nitrides); and A Cap Layer, such as GaN, AlN, or $SiN_x$, may not be present.

While CC reduction is critical, for highest performance, it should be simultaneously accompanied with low levels of gate leakage and drain leakage in the "off" state of the transistor, which has made the task of designing a low CC structure more elusive.

Gallium nitride and its related Group III-Nitride ternary and quaternary compounds have a high density of dislocations and other point defects due to the epitaxy of the material and lack of well suited lattice matched substrates. These defects induce current pathways through the buffer that are detrimental to both DC leakage and RF performance. Typically, in GaN HEMT structures, the buffer is heavily doped with carbon and/or iron impurities to mitigate the leakage in the epitaxial buffer. However, due to their close proximity to the 2DEG GaN channel, the carbon and iron impurity dopants also act as long lived traps, which may have lifetimes of microseconds, or longer, for charge carrier electrons in the 2DEG channel, significantly increasing the CC in the final HEMT device and negatively impacting performance.

As is also known in the art, theoretical calculations of the ionization energy of substitutional beryllium in GaN have estimated the ionization energy to be between 60 meV (see Bernardini et al., *Theoretical evidence for efficient p-type doping of GaN using beryllium*, arXiv:cond-mat/9610108v2 (1997)) and 550 meV (see J. L. Lyons et al., *Impact of Group-II Acceptors on the Electrical and Optical Properties of GaN*, Jpn. J. Appl. Phys. 52, 08JJ04 (2013)). In addition, interstitial beryllium has been calculated to have a low formation energy and to act as a double donor (see C. G. Van de Walle et al., *First-principles studies of beryllium doping of GaN*, Phys. Rev. B, 63, 245205 (2001)) that has the potential to lead to the compensation of substitutional beryllium acceptors. In practice, beryllium doped GaN material exhibits insulating behavior (see K. Lee et al., *Compensation in Be-doped Gallium Nitride Grown Using Molecular Beam Epitaxy*, Material Research Society Symposium, Proc. Vol. 892 (2006)) and has been used to mitigate the effects of conductive buffer layers in GaN HEMTs (see D. F. Storm et al., *Reduction of buffer layer conduction near plasma-assisted molecular-beam epitaxy grown GaN/AlN interfaces by beryllium doping*, Appl. Phys. Lett., 81, 3819 (2002)). While suitable as a buffer dopant, beryllium doping at $1 \times 10^{19}$ atoms/$cm^3$ has been shown to have deleterious effects on the 2DEG mobility, 2DEG sheet density, and transistor performance when the UID GaN layer is less than 200 nm thick (see D. F. Storm et al., *Proximity effects of beryllium-doped GaN buffer layers on the electronic properties of epitaxial AlGaN/GaN heterostructures*, Solid-State Electronics, 54, 1470-1473 (2010)). Beryllium doping levels up to $3 \times 10^{19}$ atoms/$cm^3$ have been shown to cause no significant degradation of the GaN crystal quality (see D. F. Storm et al., *Growth and characterization of plasma-assisted molecular beam epitaxial-grown AlGaN/GaN heterostructures on free-standing hydride vapor phase epitaxy GaN substrates*, J. Vac. Sci. Technol. B., 23, 1190 (2005)), however, it is expected that higher levels of beryllium doping impurities will eventually cause a deterioration of the GaN crystal quality.

SUMMARY OF THE INVENTION

In accordance with the present disclosure, a High Electron Mobility Transistor structure is provided, comprising: a GaN buffer layer disposed on the substrate; a doped GaN layer disposed on, and in direct contact with, the buffer layer, such doped GaN layer being doped with more than one different dopants, where one of the dopants is beryllium; an unintentionally doped (UID) GaN channel layer on, and in direct contact with, the doped GaN layer, such UID GaN channel layer having a two-dimensional electron gas (2DEG) channel therein.

In one embodiment; a barrier layer is disposed on, and in direct contact with, the UID GaN channel layer.

In one embodiment, one of the dopants is beryllium.

In one embodiment, one of the dopants is beryllium and another one of the dopants is carbon.

In one embodiment, the UID GaN channel layer has a thickness less than 200 nm.

In one embodiment, a High Electron Mobility Transistor structure is provided comprising: a substrate; a high-resistivity GaN buffer layer disposed on the substrate; a doped GaN layer disposed on, and in direct contact with, the buffer layer, such doped GaN layer being doped with beryllium and carbon; an unintentionally doped (UID) GaN channel layer disposed on, and in direct contact with, the doped GaN layer, such UID GaN channel layer having a 2DEG channel therein; and an AlGaN barrier layer disposed on, and in direct contact with, the UID GaN channel layer.

In one embodiment, the UID GaN layer has a thickness less than 200 nm.

In one embodiment, the doped GaN layer has a thickness of 10-300 nm.

In one embodiment, the beryllium doping is $5 \times 10^{16}$ to $3 \times 10^{19}$ atoms/cm$^3$ and the carbon doping is less than or equal to the beryllium doping.

In one embodiment, the buffer layer has a resistivity of greater than $2.2 \times 10^3$ ohm*cm.

In molecular beam epitaxy (MBE) methods, while carbon is a highly-effective compensating dopant with a number of near-mid-gap states that can drastically reduce DC leakage when used on its own as a dopant in close proximity to a 2DEG channel, it also generates additional trap sites that increase CC and reduce RF performance. The inventors recognized that moderate levels of beryllium doping ranging from $5 \times 10^{16}$ to $3 \times 10^{19}$ atoms/cm$^3$ in close proximity to a 2DEG channel is sufficient to shift the band structure of gallium nitride and its related group III-nitride ternary and quaternary compounds in the buffer layer. The inventors further recognized that by adding a reduced level of carbon impurities along with the beryllium impurities (carbon impurities<beryllium impurities) low levels of off state leakage can be obtained while simultaneously shifting the band structure of the buffer layer to reduce CC and enhance the PAE of the HEMT transistor in RF operation.

The inventors have recognized the epitaxial elements responsible for one source of CC in GaN HEMT structures and have an effective solution for overcoming it without adversely affecting the DC leakage of the device: exact placement of beryllium and carbon doped layers relative to the conductive 2DEG channel, accurately controlled thickness of the doped layers, and accurately controlled doping levels immediately below the 2DEG layer. The disclosure describes concurrently doping the GaN buffer immediately below the UID GaN channel with carbon and beryllium at various levels to overcome the electrically active carriers, without allowing the dopants in the buffer to act as high levels of active long lived traps, thus reducing the CC and keeping the off state leakages at low and manageable levels.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

Like reference symbols in the various drawings indicate like elements.

DETAILED DESCRIPTION

Figure 2:
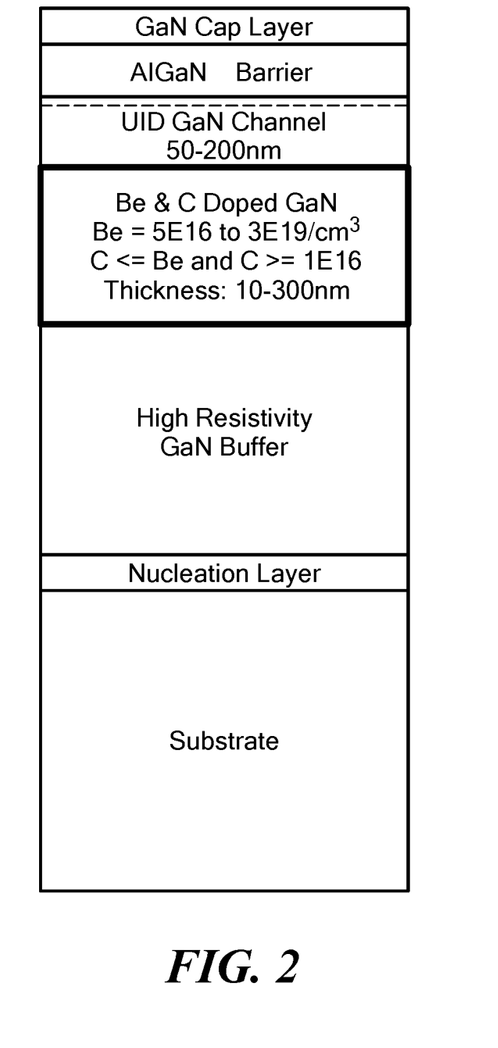
FIG. 2 is a diagrammatical, cross-sectional sketch of a Group III-Nitride HEMT structure according to the disclosure.

Referring now to FIG. 2, a HEMT structure is shown having: a single crystal substrate, here, for example, Silicon, Sapphire, or Silicon Carbide; a nucleation layer, here, for example, MN or Graphene formed epitaxially on the substrate; a doped high resistivity GaN buffer layer formed epitaxially on the nucleation layer, here such buffer layer being doped with, for example, beryllium doped GaN to have a resistivity of $2.2 \times 10^3$ ohm*cm (for $5 \times 10^{18}$ atoms/cm$^3$ doping), iron doped GaN to have a resistivity of $3 \times 10^5$ ohm*cm (see R. P. Vaudo et al., *Characteristics of semi-insulating, Fe-doped GaN substrates*, Physical Status Solidi 200, 18 (2003)), carbon doped GaN to have a resistivity of $1 \times 10^8$ ohm*cm, or combination of dopants that result in high resistivity GaN; a doped GaN layer, having a thickness of 10-300 nm and having more than one dopant, here having: a beryllium dopant having a doping concentration in a range of $5 \times 10^{16}$ to $3 \times 10^{19}$ atoms/cm$^3$; and, a carbon dopant having a doping concentration less than the doping concentration of the beryllium, but higher than $1 \times 10^{16}$ atoms/cm$^3$. The doping levels result from the co-deposition of beryllium and carbon impurities during the epitaxial growth of the doped GaN layer. Formed epitaxially on the doped GaN layer is an unintentionally doped (UID) GaN channel layer having a thickness of 50-200 nm and having a two-dimensional electron gas (2DEG) within. Formed epitaxially on the UID GaN layer is a barrier layer, such as AlGaN, InAlGaN, or ScAlN. The optimal doping density, within the ranges provided, is dependent on the thickness of the UID GaN channel layer and the charge density in the channel as controlled by the barrier material composition and thickness.

Figure 3A:
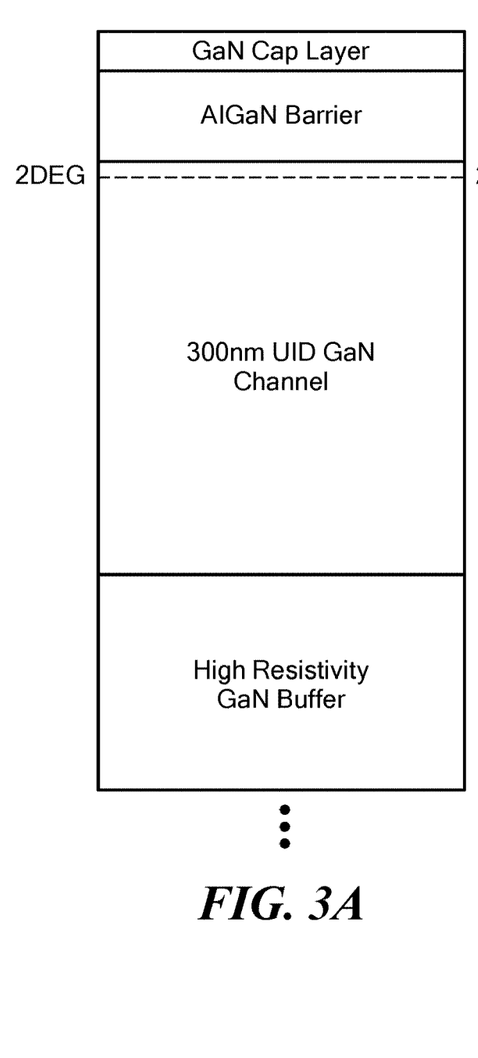
FIG. 3A is a diagrammatical, cross-sectional sketch of a Group III-Nitride HEMT structure without an additional doped layer between the UID GaN channel and the high resistivity GaN buffer, useful as comparison to the HEMT structure of FIG. 2.
Figure 3B:
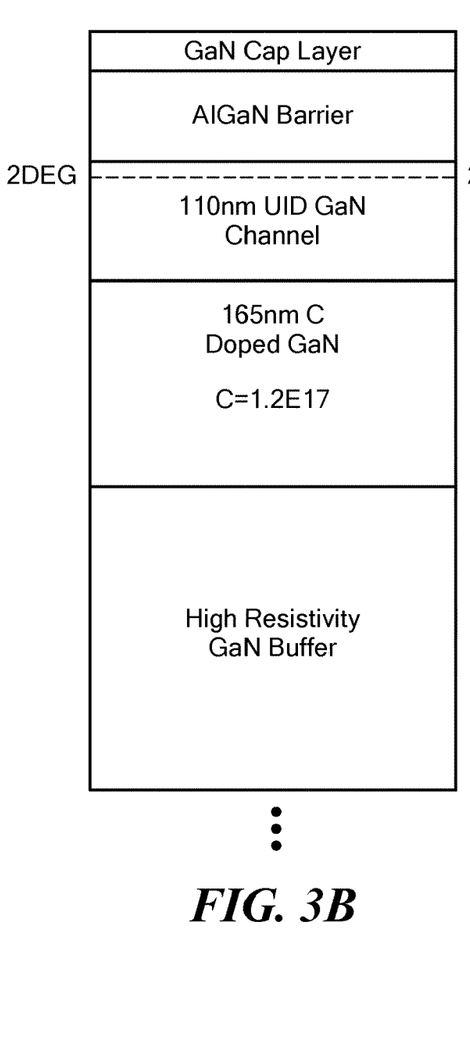
FIG. 3B is a diagrammatical, cross-sectional sketch of a Group III-Nitride HEMT structure utilizing only carbon as a dopant in the doped layer between the UID GaN channel and high resistivity GaN buffer, useful as comparison to the HEMT structure of FIG. 2.
Figure 3C:
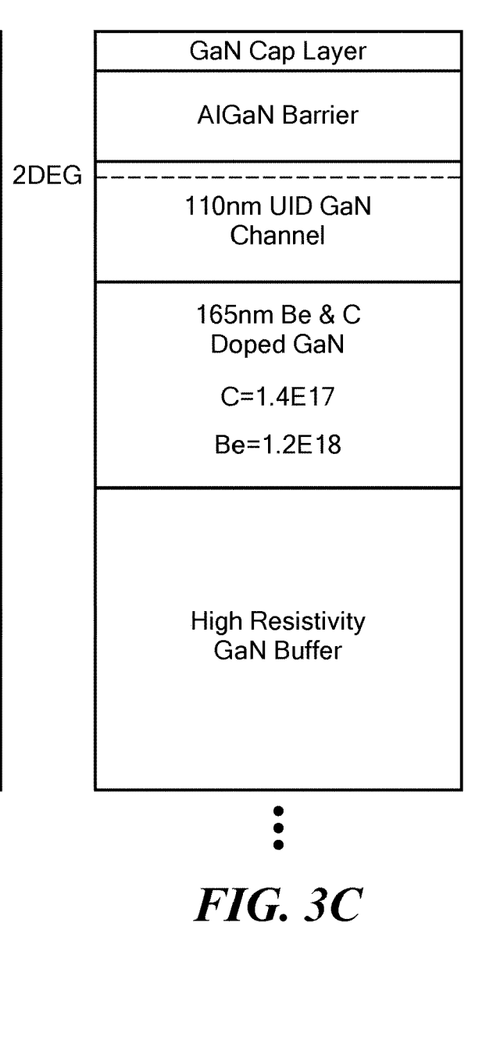
FIG. 3C is a diagrammatical, cross-sectional sketch of a Group III-Nitride HEMT structure utilizing both carbon and beryllium as dopants in the doped layer between the UID GaN channel and high resistivity GaN buffer, one embodiment of the HEMT structure of FIG. 2.

Referring now to FIGS. 3A, 3B and 3C, three HEMT structures are shown for purposes of comparison. All three structures utilize identical substrate, nucleation layer, and high resistivity GaN buffer layer structures, here SiC, AlN, and carbon and beryllium doped GaN, respectively. The structure shown in FIG. 3A has no doped layer between the UID GaN channel and high resistivity GaN buffer, achieved via a 300 nm UID channel thickness on, and in direct contact with, the high resistivity buffer layer. The structure shown in FIG. 3B has only carbon doping in the doped layer, here with a thickness of 165 nm and doped with a carbon density of $1.2 \times 10^{17}$ atoms/cm$^3$, between the UID GaN channel, here with a thickness of 110 nm, and high resistivity GaN buffer. The structure shown in FIG. 3C has both carbon and beryllium doping in the doped layer, here with a thickness of 165 nm and carbon doping density of $1.4 \times 10^{17}$ atoms/cm$^3$ and beryllium doping density of $1.2 \times 10^{18}$ atoms/cm$^3$, between the UID GaN channel, here with a thickness of 110 nm, and high resistivity GaN buffer. Here, the structures in FIGS. 3A, 3B, and 3C are grown by molecular beam epitaxy (MBE). The doped GaN layers in this particular example are formed under nitrogen-rich conditions with predetermined flux ratios of gallium, nitrogen, and dopants and predetermined growth temperatures, here 660-780° C. as measured by an optical pyrometer, that result in the desired dopant concentrations. While nitrogen-rich conditions are used here, gallium-rich conditions may also be used, although with different predetermined flux ratios and/or growth temperature. Here, beryllium is doped via thermal evaporation from a solid elemental beryllium source and carbon is doped via a CBr$_4$ gas source.

Figure 4A:
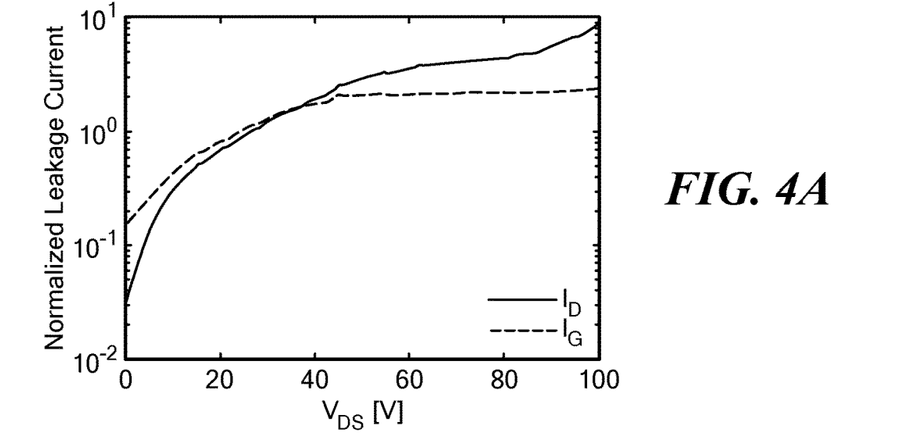
FIG. 4A is a plot of normalized drain leakage and gate leakage current versus drain-to-source voltage for the structure of FIG. 3A, without an additional doped layer, useful for understanding the benefits of the structure of FIG. 2.
Figure 4B:
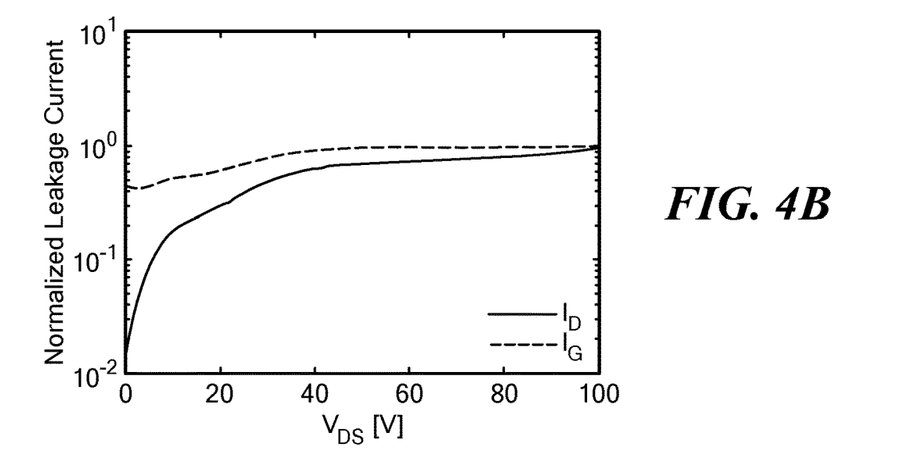
FIG. 4B is a plot of normalized drain leakage and gate leakage current versus drain-to-source voltage for the structure of FIG. 3B, utilizing only carbon doping in the doped layer, useful for understanding the benefits of the structure of FIG. 2.
Figure 4C:
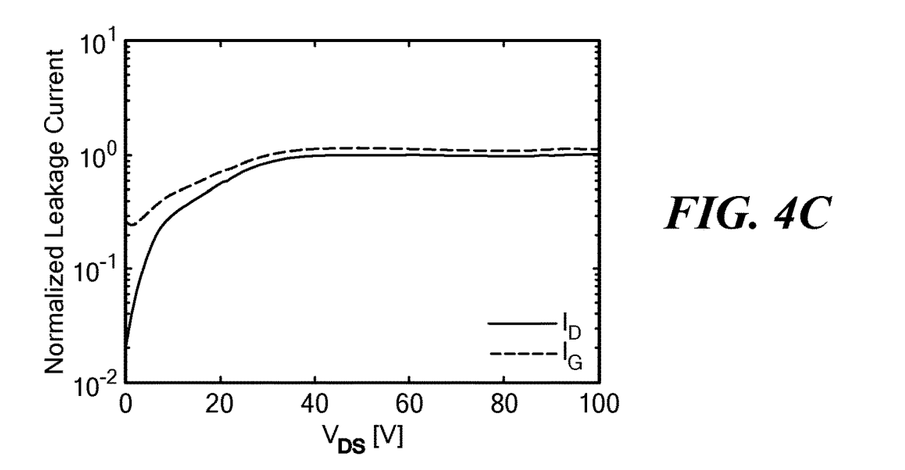
FIG. 4C is a plot of normalized drain leakage and gate leakage current versus drain-to-source voltage for the structure of FIG. 3C, utilizing both carbon and beryllium as dopants in the doped layer in one embodiment of the HEMT structure of FIG. 2.

Referring now to FIGS. 4A, 4B and 4C, normalized drain and gate leakages are shown for three terminal source-gate-drain lateral transistors, with ohmic source and drain contacts and a Schottky gate contact, fabricated from the epitaxial structures shown in FIGS. 3A, 3B and 3C, respectively. More particularly, DC measurements of three terminal source-gate-drain lateral transistors of the drain current and gate current with the gate pinched off at −6V on the gate for varying drain-to-source voltages are shown. The "ideal" is for both the drain and gate leakage current to be as low as possible. Data is normalized to the drain leakage current at 100V for the structure shown in FIG. 3C. The structure shown in FIG. 3A, without a doped layer between the UID GaN and high resistivity buffer, shows high leakage current (~3-10× the leakage current of the structure shown in FIG. 3C). The structure shown in FIG. 3B with only carbon doping in the doped layer, shows a leakage current that is low and similar to the leakage current of the structure shown in FIG. 3C; the structure in FIG. 3C having both carbon and beryllium dopants in the doped layer.

Figure 5A:
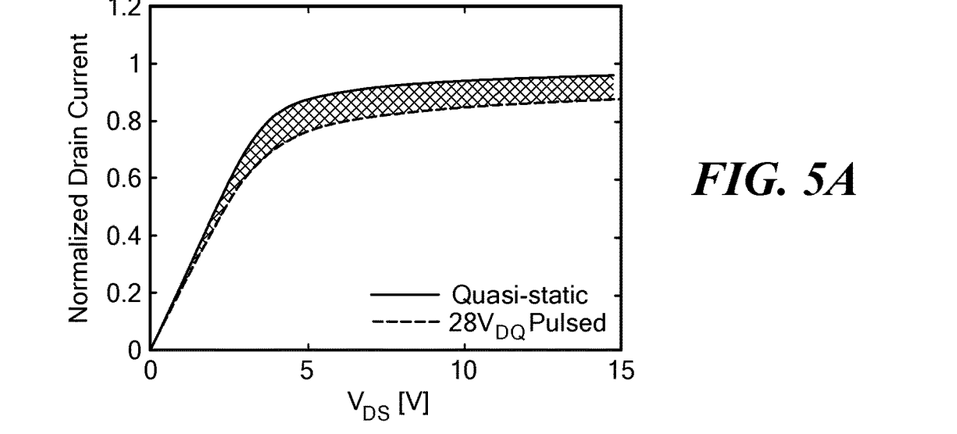
FIG. 5A is a plot of normalized drain current versus drain-to-source voltage for a quasi-static configuration and a 28V pulsed configuration highlighting the impact of current collapse for the structure of FIG. 3A, without an additional doped layer, useful for understanding the benefits of the structure of FIG. 2.
Figure 5B:
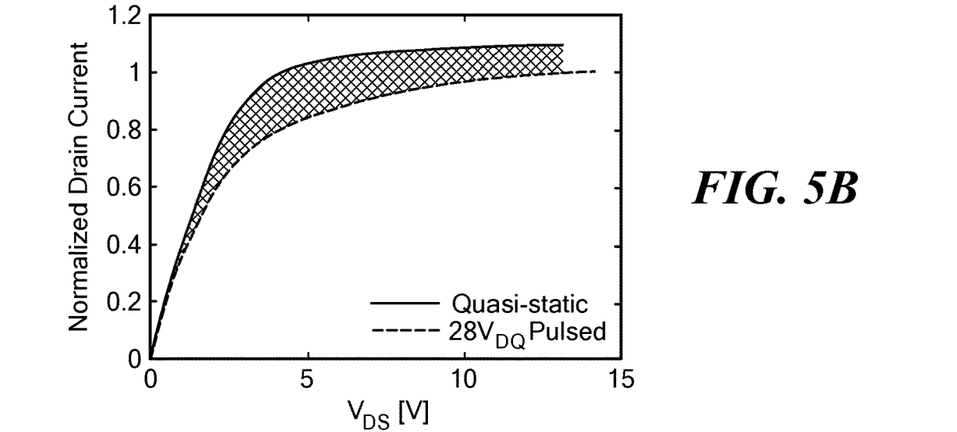
FIG. 5B is a plot of normalized drain current versus drain-to-source voltage for a quasi-static configuration and a 28V pulsed configuration highlighting the impact of current collapse for the structure of FIG. 3B, utilizing only carbon in the doped layer, useful for understanding the benefits of the structure of FIG. 2.
Figure 5C:
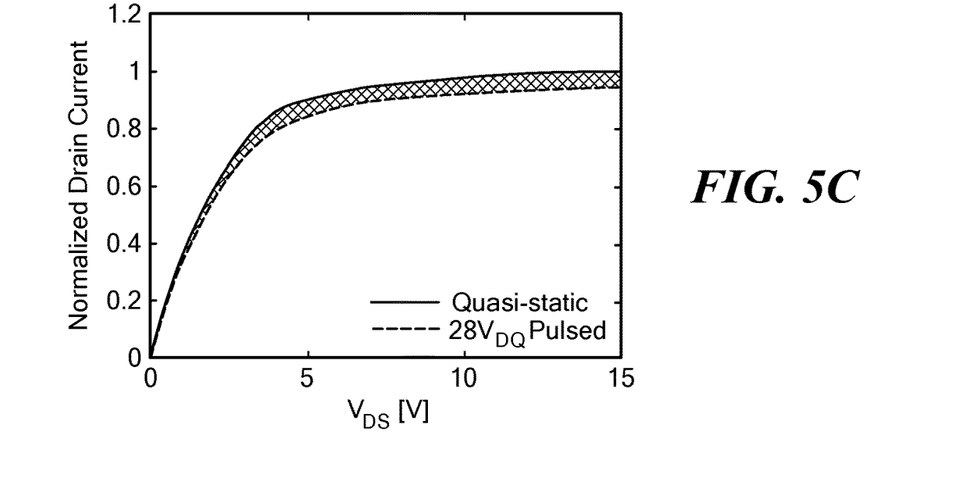
FIG. 5C is a plot of normalized drain current versus drain-to-source voltage for a quasi-static configuration and a 28V pulsed configuration highlighting the impact of current collapse for the structure of FIG. 3C, utilizing both carbon and beryllium as dopants in the doped layer in one embodiment of the HEMT structure of FIG. 2.

Referring to FIGS. 5A, 5B and 5C, pulsed IV measurements are shown for the transistors fabricated from the epitaxial structures shown in FIGS. 3A, 3B and 3C, respectively. For the quasi-static curve, the quiescent bias point is $V_{DQ}=V_{GQ}=0$ V. For the 28 $V_{DQ}$ curve, the quiescent bias point is $V_{DQ}=28$ V, $I_{DQ}=110$ mA. "Ideal" is to minimize the shaded area, a measure of current collapse (or dispersion), to zero. The data is normalized to the quasi-static drain current at 15 V for the structure shown in FIG. 3C. The structure shown in FIG. 3A, without a doped layer between the UID GaN and high resistivity buffer, shows the current collapse is low (but this is the result of high leakage as shown in FIG. 4A). The structure shown in FIG. 3B, which has only carbon doping in the doped layer, shows relatively high current collapse as compared with the current collapse of the structure shown in FIG. 3C, which has both carbon and beryllium doping in the doped layer, as shown in FIG. 5C. Thus, the structure shown in FIG. 3C, with both carbon and beryllium doping in the doped layer, has both a very low current collapse and low leakage.

A number of embodiments of the disclosure have been described. Nevertheless, it will be understood that various modifications may be made without departing from the spirit and scope of the disclosure. For example, one may utilize a stepped or graded doping profile within the doped GaN layer. Also, for example, while doped GaN has been described, it should be understood that other group III-N doped materials may be used such as doped AlGaN. Similarly, the use of different group III-N barrier, channel, or buffer layer materials than GaN and AlGaN may be used, including, for example, composite barriers with more than one material or composition of barrier material (such as AlGaN/InAlN or InAlGaN. Additionally, alternate doping sources such as solid source carbon may be used. Further, the disclosure does not depend on the use of any specific substrate, nucleation layer, or high-resistivity buffer dopant. Accordingly, other embodiments are within the scope of the following claims.

What is claimed is:

1. A High Electron Mobility Transistor structure, comprising:
   a substrate;
   a high resistivity GaN buffer layer disposed on the substrate, the high resistivity GaN buffer layer doped with beryllium and having a resistivity greater than $2.2 \times 10^3$ ohm*cm;
   a doped GaN thin film layer disposed on, and in direct contact with, the high resistivity GaN buffer layer, the doped GaN thin film layer having a thickness between 10 and 300 nm and having multiple different dopants where one of the dopants is beryllium and wherein the beryllium doping is $5 \times 10^{16}$ to $3 \times 10^{19}$ atoms/cm$^3$ and one of the dopants is carbon and wherein the carbon doping is less than the beryllium doping but higher than $1 \times 10^{16}$ atoms/cm$^3$; and
   an unintentionally doped (UID) GaN channel layer on, and in direct contact with, the doped GaN thin film layer, the UID GaN channel layer having a 2DEG channel therein and wherein the UID GaN channel layer has a thickness between 50 and 200 nm.

2. The structure recited in claim 1 including a barrier layer on, and in direct contact with, the UID GaN channel layer.

3. The structure recited in claim 1 including a nucleation layer disposed on the substrate.

4. A High Electron Mobility Transistor structure, comprising:
   a substrate;
   a high resistivity GaN buffer layer disposed on the substrate, the high resistivity GaN buffer layer having a resistivity greater than $2.2 \times 10^3$ ohm*cm;
   a doped GaN thin film layer disposed on, and in direct contact with, the high resistivity GaN buffer layer, the doped GaN thin film layer being doped with beryllium and carbon and wherein the beryllium doping is $5 \times 10^{16}$ to $3 \times 10^{19}$ atoms/cm$^3$ and wherein the carbon doping is less than the beryllium doping but higher than $1 \times 10^{16}$ atoms/cm$^3$; and
   an unintentionally doped (UID) GaN channel layer on, and in direct contact with, the doped GaN thin film layer, the UID GaN channel layer having a 2DEG channel therein and wherein the UID GaN channel layer has a thickness less than 200 nm.

5. The structure recited in claim 4 wherein the UID GaN channel layer has a thickness between 50 and 200 nm.

6. The structure recited in claim 4 wherein the doped GaN thin film layer has a thickness of 10 to 300 nm.

7. The structure recited in claim 4 including a barrier layer on, and in direct contact with, the UID GaN channel layer.

8. A High Electron Mobility Transistor structure, comprising:
- a substrate;
- a high resistivity GaN buffer layer disposed on the substrate, the high resistivity GaN buffer layer doped with beryllium, iron and/or carbon;
- a doped GaN thin film layer disposed on, and in direct contact with, the high resistivity GaN buffer layer, the doped GaN thin film layer being doped with beryllium and carbon and wherein the beryllium doping is $5 \times 10^{16}$ to $3 \times 10^{19}$ atoms/cm$^3$ and wherein the carbon doping is less than the beryllium doping but higher than $1 \times 10^{16}$ atoms/cm$^3$; and
- an unintentionally doped (UID) GaN channel layer on, and in direct contact with, the doped GaN thin film layer, the UID GaN channel layer having a 2DEG channel therein and wherein the UID GaN channel layer has a thickness less than 200 nm.

9. The structure recited in claim 8 wherein the UID GaN channel layer has a thickness between 50 and 200 nm.

10. The structure recited in claim 8 wherein the doped GaN thin film layer has a thickness of 10 to 300 nm.

\* \* \* \* \*